(12) United States Patent
Kim (10) Patent No.: US 9,154,096 B2
(45) Date of Patent: Oct. 6, 2015

(54) APPARATUS AND METHOD FOR CONTROLLING SOUND OUTPUT

(71) Applicant: Hyundai Motor Company, Seoul (KR)

(72) Inventor: Seong Un Kim, Suwon-si (KR)

(73) Assignee: HYUNDAI MOTOR COMPANY, Seoul (KR)

(*) Notice: Subject to any disclaimer, the term of this patent is extended or adjusted under 35 U.S.C. 154(b) by 140 days.

(21) Appl. No.: 14/142,494

(22) Filed: Dec. 27, 2013

(65) Prior Publication Data

US 2015/0098588 A1    Apr. 9, 2015

(30) Foreign Application Priority Data

Oct. 8, 2013  (KR) .................. 10-2013-0119733

(51) Int. Cl.
 *H03G 3/20*  (2006.01)
 *H04R 3/00*  (2006.01)
 *H04R 3/04*  (2006.01)

(52) U.S. Cl.
 CPC .. *H03G 3/20* (2013.01); *H04R 3/04* (2013.01); *H04R 2430/01* (2013.01); *H04R 2430/03* (2013.01); *H04R 2499/13* (2013.01)

(58) Field of Classification Search
 CPC .............................................. H03G 2201/508
 See application file for complete search history.

(56) References Cited

U.S. PATENT DOCUMENTS

| | | | | |
|---|---|---|---|---|
| 5,528,695 A * | 6/1996 | Klippel | ........................... | 381/55 |
| 6,865,274 B1 * | 3/2005 | Aarts et al. | ...................... | 381/55 |
| 7,013,011 B1 * | 3/2006 | Weeks et al. | ..................... | 381/98 |
| 8,965,011 B2 * | 2/2015 | Helsloot | ........................ | 381/120 |
| 2005/0058303 A1 * | 3/2005 | Martin et al. | .................... | 381/98 |
| 2008/0187149 A1 * | 8/2008 | Jung | ................................. | 381/72 |
| 2012/0008797 A1 * | 1/2012 | Banba et al. | .................... | 381/97 |
| 2012/0051558 A1 * | 3/2012 | Kim et al. | ........................ | 381/98 |
| 2013/0336502 A1 | 12/2013 | Jung et al. | | |

FOREIGN PATENT DOCUMENTS

| | | |
|---|---|---|
| JP | 05-328479 | 12/1993 |
| KR | 10-0678020 B1 | 1/2007 |
| KR | 10-2008-0072225 A | 8/2008 |
| KR | 10-2010-028272 A | 3/2010 |
| KR | 10-2010-0067251 A | 6/2010 |
| KR | 10-2011-0071347 A | 6/2011 |
| KR | 10-2011-0120821 A | 11/2011 |

* cited by examiner

*Primary Examiner* — Wayne Young
*Assistant Examiner* — Mark Fischer
(74) *Attorney, Agent, or Firm* — McDermott Will & Emery LLP (57) ABSTRACT

The present disclosure relates to an apparatus and a method for controlling sound output. The apparatus includes a sound processor configured to amplify a sound signal to a certain level to output an output signal to a speaker. An analyzer is configured to monitor whether an output level of the output signal output from the sound processor exceeds a maximum output level of the speaker between the sound processor and the speaker, and to convert the output signal into a signal of a frequency domain to analyze an energy amount for each frequency when the output level of the output signal exceeds the maximum output level of the speaker. A controller is configured to control a volume for the output signal of the corresponding frequency band when a frequency band having the energy amount exceeding the threshold value is detected from the analyzer.

12 Claims, 5 Drawing Sheets

APPARATUS AND METHOD FOR CONTROLLING SOUND OUTPUT

CROSS-REFERENCE TO RELATED APPLICATION

This application claims the benefit of priority to Korean Patent Application No. 10-2013-0119733, filed on Oct. 8, 2013 in the Korean Intellectual Property Office, the disclosure of which is incorporated herein in its entirety by reference.

TECHNICAL FIELD

The present disclosure relates to an apparatus and a method for controlling sound output, and more particularly, to a technology for controlling an output level for an output signal output by a speaker prior to outputting the signal.

BACKGROUND

Generally, vehicle sound, such as a warning sound, a guidance voice, and the like is output through internal or external speaker signals output from a built-in amplifier of a cluster. The signals output through the speaker are prevented from being output at a certain level or higher through a process of advance tuning the signal having a certain level.

However, if the sound simultaneously generated in multi-channels is output through the speaker, it is possible to exceed the output level limit of the speaker, or an interference between the sounds simultaneously generated in the multi-channels may occur, generating a distorted output through the speaker, thereby causing discomfort to a driver.

In addition, although a warning sound or alarm has a main frequency which is simple and fixed, when the warning sound or alarm is combined with a guidance voice it is possible to temporarily exceed the output range of the speaker because the combined sound consists of various frequency bands.

SUMMARY

The present disclosure has been made in view of the above problems, and provides an apparatus and a method for controlling sound output to enable each sound to be output stably through a speaker by detecting a change in the output level of the sound in advance to adjust the level of the output signal in accordance with the priority order and frequency characteristics of each sound when outputting the sound generated in a vehicle through a speaker.

In accordance with an aspect of the present disclosure, an apparatus for controlling sound output includes a sound processor configured to amplify a sound signal to a certain level to output an output signal to a speaker. An analyzer is configured to monitor whether an output level of the output signal output from the sound processor exceeds a maximum output level of the speaker between the sound processor and the speaker, and to convert the output signal into a signal of a frequency domain to analyze an energy amount for each frequency when the output level of the output signal exceeds the maximum output level of the speaker. A controller is configured to control a sound output of the sound processor and to control a volume for the output signal of the corresponding frequency band when a frequency band having an energy amount exceeding the threshold value is detected from the analyzer.

In accordance with an aspect of the present disclosure, an apparatus for controlling sound output further includes a database (DB) storing the sound data and set data for outputting the sound. The database stores at least one among the sound data, a main frequency for each sound, a sound output priority order, a default sound volume, the speaker maximum output level, a maximum amplifier (AMP) output limit value, and a volume control data for each excess output level. The analyzer performs Fourier transformation (FT) on the output signal to analyze the energy amount for each frequency band of the corresponding sound when the output level of the output signal exceeds the speaker maximum output level stored in the database. The analyzer provides information on the frequency band having an energy amount exceeding the threshold value to the controller, when at least one among the energy amount for each frequency bands of the corresponding sound exceeds the threshold value. The controller controls the volume of the output signal pertinent to the corresponding frequency band based on the information of the frequency band having the energy amount exceeding the threshold value from the analyzer. The controller controls the volume in such a manner that a priority order is given to the signal of the frequency band having a higher energy amount among the signals of the frequency bands having the energy amount exceeding the threshold value when the frequency bands having the energy amount exceeding the threshold value is two or more. The controller controls the volume according to the output priority order stored in the database with respect to the signal of the frequency band having the energy amount exceeding the threshold value, when a number of the frequency band having the energy amount exceeding the threshold value exceeds a set number. The sound processor includes: a digital to analog (DA) converter configured to convert the sound data output from the controller; and an amplifier (AMP) configured to amplify the level of the signal converted by the DA converter into the output level of the volume requested by the controller.

In accordance with an aspect of the present disclosure, an apparatus for controlling sound output further includes an analog to digital (AD) converter configured to convert the output signal output from the sound processor to output the converted signal to the analyzer between the sound processor and the speaker.

In accordance with an aspect of the present disclosure, a method for controlling sound output includes outputting an output signal of an output level required for a sound to a speaker. Whether an output level of the output signal output through the speaker exceeds a maximum output level of the speaker is monitored. The output signal is converted into a signal of a frequency domain when the output level of the output signal exceeds the maximum output level of the speaker and an energy amount for each frequency is analyzed. The volume of the output signal is controlled corresponding to the frequency band having the energy amount exceeding a threshold value among the output signals of each frequency band when a frequency band having the energy amount exceeding the threshold value is detected, as the analysis results. The controlling of the volume of the output signal includes controlling the volume in such a manner that a priority order is given to the signal of the frequency band having a higher energy amount among the signal of the frequency bands having the energy amount exceeding the threshold value when the frequency bands having the energy amount exceeding the threshold value is two or more. The controlling of the volume for the output signal includes controlling the volume according to the output priority order stored in the database with respect to the signals of the frequency bands having the energy amount exceeding the threshold value, when a number of the frequency band having the energy amount exceeding the threshold value exceeds a set number.

BRIEF DESCRIPTION OF THE DRAWINGS

The objects, features, and advantages of the present disclosure will be more apparent from the following detailed description in conjunction with the accompanying drawings.

DETAILED DESCRIPTION

Exemplary embodiments of the present disclosure are described in detail with reference to the accompanying drawings. The same reference numbers are used throughout the drawings to refer to the same or like parts. Detailed descriptions of well-known functions and structures incorporated herein may be omitted to avoid obscuring the subject matter of the present disclosure.

Figure 1:
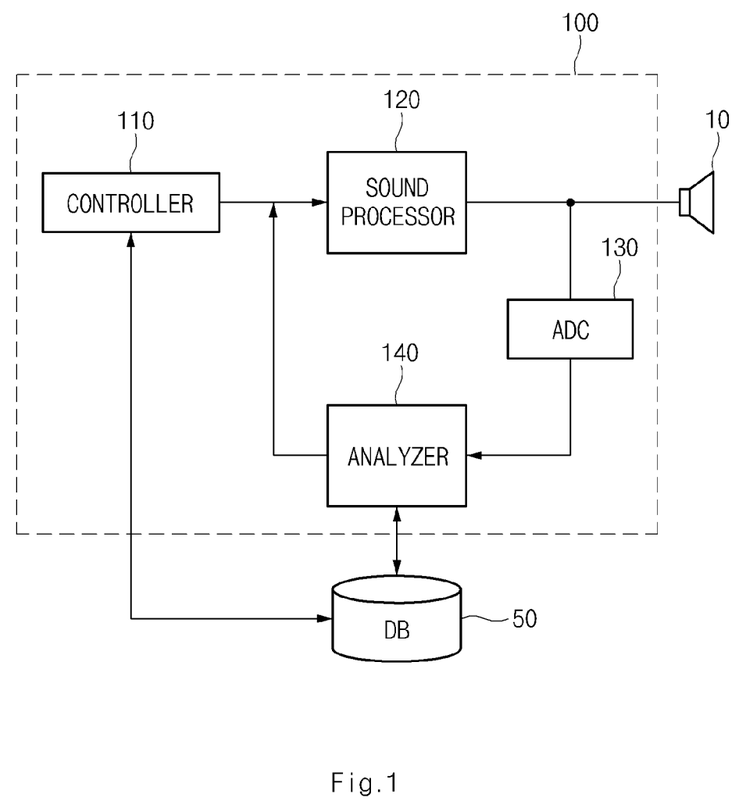
FIG. 1 is a block diagram illustrating a configuration of an apparatus for controlling sound output according to an exemplary embodiment of the present disclosure.

FIG. 1 is a block diagram illustrating a configuration of an apparatus for controlling sound output according to an exemplary embodiment of the present disclosure. Referring to FIG. 1, an apparatus for controlling sound output 100 includes a controller 110, a sound processor 120, an analog to digital converter (ADC) 130, and an analyzer 140. In addition, the apparatus for controlling sound output 100 may further include a database (DB) 50.

Figure 2:
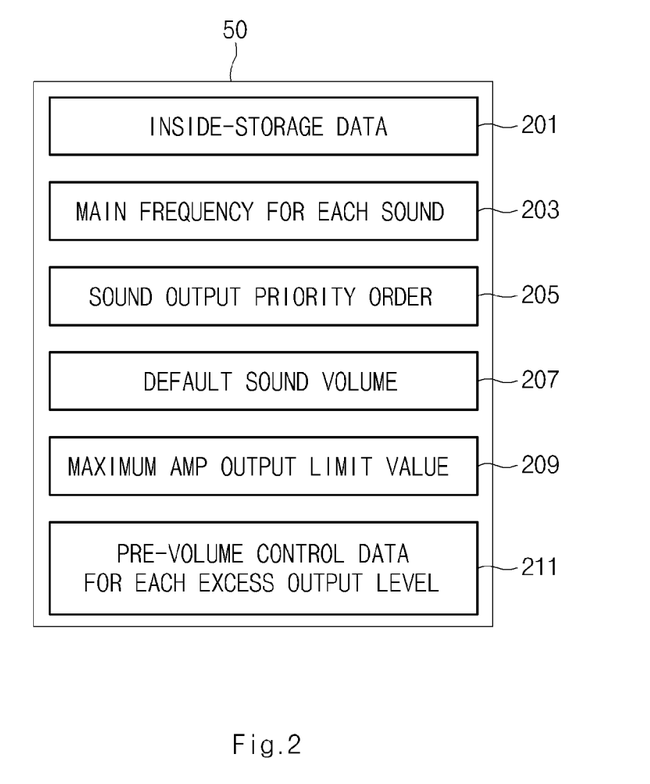
FIG. 2 is a block diagram illustrating a database according to an exemplary embodiment of the present disclosure.

Here, the database 50, in which a sound data output to a speaker 10 through the apparatus 100 for controlling sound output and a set data for the output of the sound data are stored, may be implemented in the inside of the apparatus 100 for controlling sound output, or may be implemented outside of and connected to the apparatus 100 for controlling sound output. As shown in FIG. 2, the database 50 may store at least one of the sound data, a main frequency for each sound, a sound output priority order, a default sound volume, the maximum amplifier (AMP) output limit value, and a volume control data for each excess output level.

In addition, the speaker 10 according to the exemplary embodiment of the present disclosure may be an internal or external speaker provided in the vehicle. For example, the speaker may be provided in a cluster, however, the present disclosure is not limited thereto.

The controller 110 provides the sound data stored in the database 50 to the sound processor 120. Here, the controller 110 outputs the control signal for controlling the output of the sound data to the sound processor 120 based on the set data for outputting of the sound data stored in the database 50.

For example, the controller 110 outputs information on the output frequency for each sound and information on the output level of each frequency to the sound processor 120 based on the sound data stored in the database 50, the main frequency for each sound corresponding to the sound data, the sound output priority order, the default sound volume, and the like.

Therefore, the sound processor 120 outputs the output signal corresponding to the sound to the speaker 10 according to the control signal received from the controller 110. Here, if the control signal is input from the controller 110, the sound processor 120 generates a frequency that is required for the sound and a signal corresponding to the output level of each frequency to output the generated output signal to the connected speaker. The output signal output by the sound processor 120 is to be output through the connected speaker 10.

The analog to digital (AD) converter 130 is connected between an output terminal of the sound processor 120 and an input terminal of the speaker 10 to convert the output signal that is output from the sound source processor 120. Here, the AD converter 130 converts an analog signal that is output from the sound processor 120 into a digital signal to provide the converted digital signal to the analyzer 140. In this case, the AD converter 130 converts, in real time, all the output signal that is output from the sound processor 120 to provide the converted signal to the analyzer 140.

The analyzer 140 monitors whether the output level of the output signal converted into the digital signal by the AD converter 130 exceeds the maximum output level of the speaker 10. Here, the analyzer 140 calls the information on the maximum output level of the speaker 10 by accessing the database 50 and may compare the output level of the output signal with the maximum output level of the called speaker 10.

In this case, if the output level of the output signal does not exceed the maximum output level of the speaker 10, the analyzer 140 monitors the output level of the output signal converted into the digital signal by the AD converter 130.

Meanwhile, if the output level of the output signal converted into the digital signal by the AD converter 130 exceeds the maximum output level of the speaker 10, the analyzer 140 converts the output signal into the signal of a frequency domain. In other words, the analyzer 140 converts the output signal into the signal of the frequency domain by performing a Fourier transform (FT) or a fast Fourier transform (FFT). At this time, the analyzer 140 analyzes the energy amount for each frequency band of the sound corresponding to the Fourier transformed output signal.

The analyzer 140 checks a threshold value defined in advance for the energy amount for each frequency band and checks whether there is a frequency band that exceeds a threshold value among an energy amount for each frequency band of the output signal. If the energy amount of the output signal corresponding to at least one frequency band exceeds the threshold value, the analyzer 140 detects the information on the frequency band having the energy amount that exceeds the threshold value to provide the detected information to the controller 110.

In this case, the controller 110 controls the control information on the sound that is output to the sound processor 120 based on the information on the frequency bands having the energy amount that exceeds the threshold value provided from the analyzer 140.

In detail, the controller 110 outputs the control information to the sound processor 120, when the control information controls the volume of the output signal corresponding to the frequency band having the energy amount that exceeds the threshold value provided from the analyzer 140 among the signals requesting the sound processor 120 to output the sound. In this case, the controller 110 enables the volume of the output signal to be controlled based on the volume control data of the frequency bands having the energy amount that exceeds the threshold value in the pre-volume control data for each excess output level stored in the DB.

If the frequency bands having the energy amount that exceeds the threshold value is two or more the controller 110 may control the volume of the signal of the corresponding frequency bands based on the amount of energy of each frequency band.

Meanwhile, if the number of the frequency bands having the energy amount that exceeds the threshold value exceeds the set number, the controller 110 may control the volume for the output signal of each frequency band according to the output priority order stored in the database 50.

Therefore, the sound processor 120 outputs the signal of the output level corresponding to the requested volume according to the control information requested by the controller 110. If there is a change of the control information by the controller 110, the sound processor 120 outputs the signal by converting the output level for the output signal of the corresponding frequency band according to the changed control information.

FIG. 2 is a block diagram illustrating a database according to an exemplary embodiment of the present disclosure. Referring to FIG. 2, the database 50 may store the sound data, the main frequency for each sound, the sound output priority order, the default sound volume, the speaker maximum output level, the maximum AMP output limit value, the volume control data for each excess output level, and the like.

Here, the sound data is a data including a sound output by the sound processor 120. For example, the sound data may include music, a guidance sound, an effect sound, a warning sound, and the like. In addition, the sound data may include any sound that may be stored in a data format and be output through the speaker.

The sound output priority order means an output priority order of the output signal corresponding to each frequency band among the sound that is requested to be output. The apparatus for controlling sound output controls the output of the signal corresponding to each frequency of the corresponding sound based on the sound output priority order stored in the database 50. In addition, if the output level of the output signal output through the speaker exceeds the maximum output level of the speaker, when determining the order of controlling the volume for each frequency band of the corresponding sound, the apparatus for controlling sound output may use the sound output priority order.

The speaker maximum output level means the maximum output level capable of being output through the connected speaker. The apparatus for controlling sound output determines the volume control of the corresponding output signal based on information on the speaker maximum output level which is stored in the database 50.

When the output level of the output signal output from the apparatus for controlling sound output to the speaker exceeds the speaker maximum output level, the pre-volume control data for each excess output level is the volume control data for the exceeded output level. Here, when an energy amount over the threshold value is detected in a specific frequency band, the apparatus for controlling sound output controls the volume for the signal of the corresponding frequency band based on the pre-volume control data for each excess output level.

Figure 3:
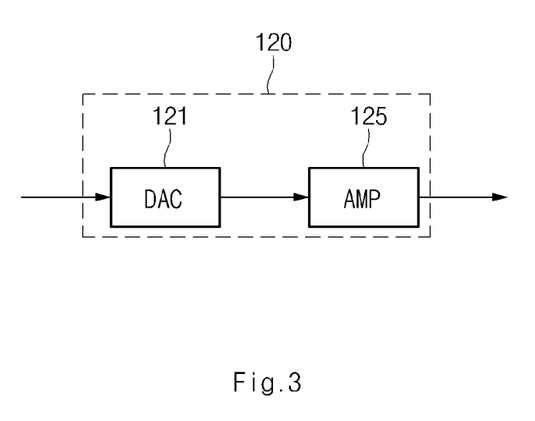
FIG. 3 is a block diagram illustrating a detailed configuration of a sound processor according to an exemplary embodiment of the present disclosure.

FIG. 3 is a block diagram illustrating a detailed configuration of a sound processor according to an exemplary embodiment of the present disclosure. Referring to FIG. 3, the sound processor 120 includes a digital to analog converter (DAC) 121 and an amplifier (AMP) 125.

The signal, the sound and the control information output from the controller, of FIG. 1 is input to the DA converter 121 of the sound processor 120. In certain embodiments, as the signal output from the controller is a digital signal, the DA converter 121 converts the digital signal output from the controller into an analog signal to transfer the converted analog signal to the amplifier 125.

The amplifier 125 amplifies the analog signal transferred from the DA converter 121 to a signal having a certain level based on the control information received from the controller. Here, the amplifier 125 amplifies the signal input according to the initial control information input from the controller to the signal of the corresponding level to output the amplified output signal to the speaker. If the changed control information, and the output level changed for the signal of the specific frequency or for each frequency are input from the controller, the amplifier 125 controls the output level of the signal corresponding to the frequency according to the control information changed from the controller to output the output signal to the speaker.

Meanwhile, the sound processor 120 is provided with a memory inside that stores the control information input from the controller and generates the output signal of the sound according to the control information stored in the memory. However, a configuration of the memory is not shown in FIG. 3.

Figure 4:
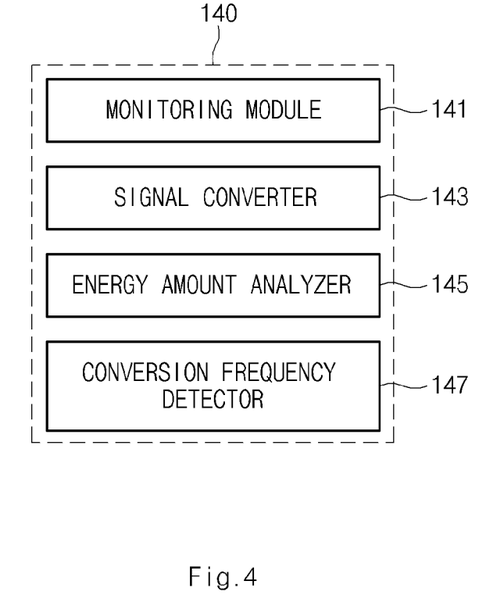
FIG. 4 is a block diagram illustrating a detailed configuration of an analyzer according to an exemplary embodiment of the present disclosure.

FIG. 4 is a block diagram illustrating a detailed configuration of an analyzer according to an exemplary embodiment of the present disclosure. Referring to FIG. 4, the analyzer 140 includes a monitoring module 141, a signal converter 143, an energy amount analyzer 145, and a conversion frequency detector 147.

The monitoring module 141 monitors in real time whether the output level of the output signal output to the speaker in the apparatus for controlling sound output exceeds the maximum output level of the speaker. In this case, the signal input to the monitoring module 141 is a signal converted into the digital signal by the AD converter 130.

When the monitoring module 141 senses that the output level of the output signal exceeds the maximum output level of the speaker, the signal converter 143 converts the output signal into a signal of a frequency domain. In other words, the analyzer 140 converts the output signal into the signal of the frequency domain by performing Fourier transformation (FT).

The energy amount analyzer 145 analyzes the energy amount for each frequency band of the output signal converted by the signal converter 143 and checks whether there is a frequency band that exceeds a preset threshold value among the energy amount for each frequency band corresponding to the output signal. The conversion frequency detector 147 detects the frequency bands that exceed the preset threshold value among the energy amount for each frequency band corresponding to the output signal from the analysis results of the energy amount analyzer 145.

Therefore, the apparatus for controlling sound output controls the output level of the signal of the corresponding frequency band based on the information on the frequency band detected by the conversion frequency detector 147. Thus, the apparatus for controlling sound output controls the output level of the output signal output from the apparatus for controlling sound output so as not to exceed the maximum output level of the speaker prior to outputting the signal through the speaker.

A detailed description of an operation flow of the apparatus for controlling sound output according to the present disclosure configured as described above will be described below.

Figure 5:
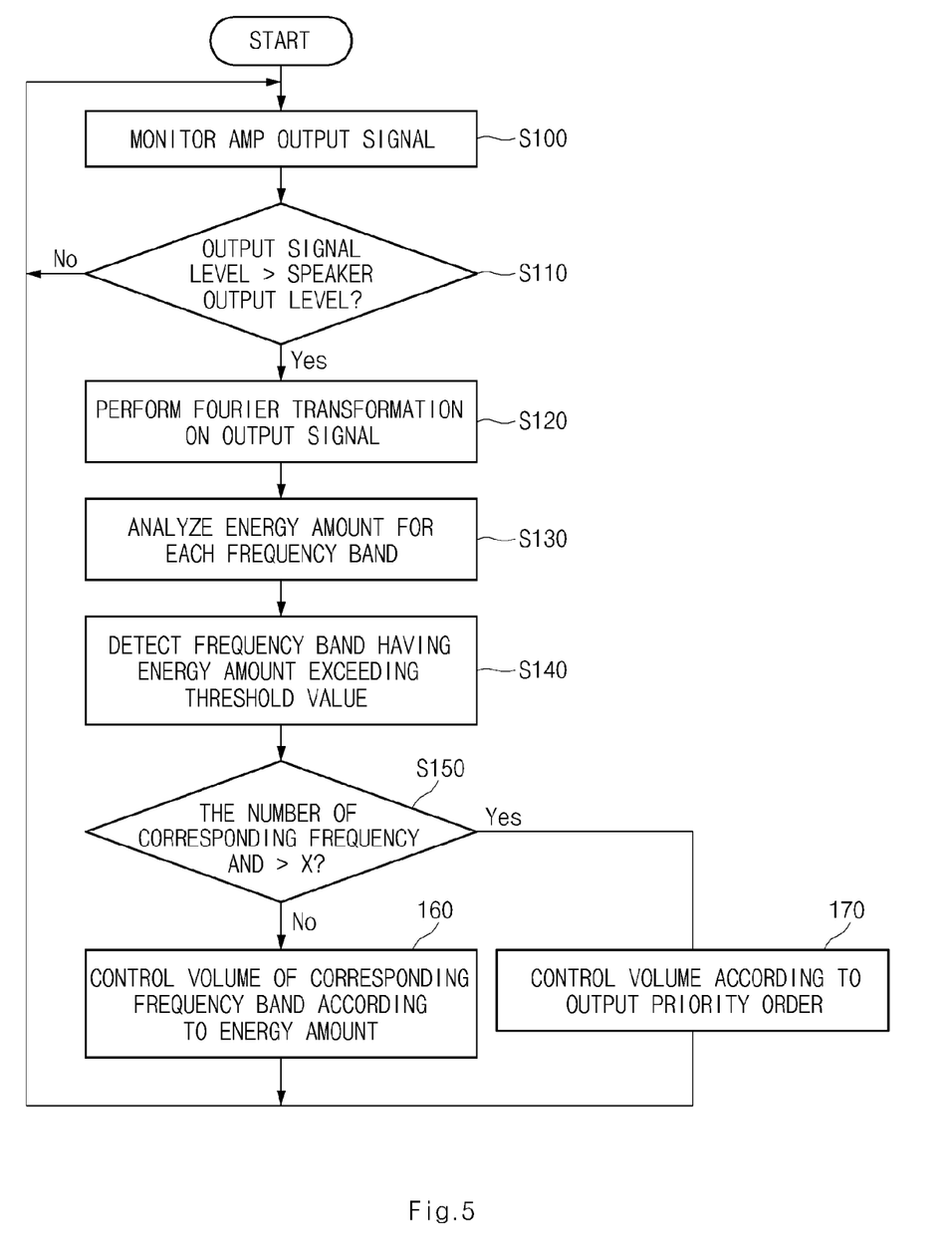
FIG. 5 is a flowchart illustrating an operation flow of a method for controlling sound output according to an exemplary embodiment of the present disclosure.

FIG. 5 is a flowchart illustrating an operation flow of a method for controlling sound output according to an exemplary embodiment of the present disclosure. Referring to FIG. 5, the apparatus for controlling sound output according to the present disclosure monitors, in real-time, the output level of the output signal output to the speaker through the AMP of the apparatus for controlling sound output (S100). If the output level of the output signal output to the speaker through the AMP exceeds the speaker maximum output level, the apparatus for controlling sound output performs Fourier transformation (FT) on the corresponding output signal (S120) to analyze the energy amount for each frequency band (S130). As a result of analyzing the energy amount at step S130, the apparatus for controlling sound output detects the frequency band having an energy amount exceeding the threshold value (S140).

When the number of frequency bands detected at step S140 does not exceed threshold value x (S150), the apparatus for controlling sound output controls the volume for the signal of the corresponding frequency band according to the energy amount of the detected frequency bands (S160). Meanwhile, when the number of frequency band exceeds the threshold value x at step S150, the apparatus for controlling sound output controls the volume of the signal for each frequency band according to the output priority order stored in the database (S170).

The processes of steps S100 to step S170 are repeatedly performed while the output signal is output from the apparatus for controlling sound output to the speaker, and the processes are ended when the sound output through the speaker is interrupted.

According to the present disclosure, each sound can be stably output through the speaker by previously detecting the change of the output level of the sound to adjust the level of the output signal, prior to outputting through the speaker, in accordance with the priority order and frequency characteristics of each sound when outputting the sound generated in a vehicle through the speaker.

Although exemplary embodiments of the present disclosure have been described in detail hereinabove, it should be clearly understood that many variations and modifications of the basic inventive concepts herein taught which may appear to those skilled in the present art will still fall within the spirit and scope of the present disclosure, as defined in the appended claims.

What is claimed is:

1. An apparatus for controlling sound output, comprising:
   a sound processor configured to amplify a sound signal to a certain level to output an output signal to a speaker;
   an analyzer configured to monitor whether an output level of the output signal output from the sound processor exceeds a maximum output level of the speaker between the sound processor and the speaker, and in response to the output level of the output signal exceeding the maximum output level of the speaker, to convert the output signal into a signal of a frequency domain to analyze an energy amount for each frequency; and
   a controller configured to control a sound output of the sound processor and to control a volume for the output signal of a corresponding frequency band when a frequency band having an energy amount exceeding a threshold value is detected from the analyzer.

2. The apparatus for controlling sound output of claim 1, further comprising a database storing the sound data and set data for outputting the sound, wherein the database stores at least one among the sound data, a main frequency for each sound, a sound output priority order, a default sound volume, the speaker maximum output level, a maximum amplifier output limit value, and a volume control data for each excess output level.

3. The apparatus for controlling sound output of claim 2, wherein the analyzer performs a Fourier transformation (FT) on the output signal to analyze the energy amount for each frequency band of the corresponding sound when the output level of the output signal exceeds the speaker maximum output level stored in the database.

4. The apparatus for controlling sound output of claim 3, wherein the analyzer provides information on the frequency band having the energy amount exceeding the threshold value to the controller, when at least one among the energy amount for each frequency band of the corresponding sound exceeds the threshold value.

5. The apparatus for controlling sound output of claim 4, wherein the controller controls the volume of the output signal of a corresponding frequency band based on the information of the frequency band having the energy amount exceeding the threshold value from the analyzer.

6. The apparatus for controlling sound output of claim 5, wherein the controller controls the volume in such a manner that a priority order is given to the signal of the frequency band having a higher energy amount among the signals of the frequency bands having the energy amount exceeding the threshold value when the frequency bands having the energy amount exceeding the threshold value is two or more.

7. The apparatus for controlling sound output of claim 5, wherein the controller controls the volume according to an output priority order stored in the database with respect to the signal of the frequency bands having the energy amount exceeding the threshold value, when a number of the frequency bands having the energy amount exceeding the threshold value exceeds a set number.

8. The apparatus for controlling sound output of claim 1, wherein the sound processor comprises:
   a digital to analog converter configured to convert the sound data output from the controller; and
   an amplifier configured to amplify the level of the signal converted by the digital to analog converter to an output level of the volume requested by the controller.

9. The apparatus for controlling sound output of claim 8, further comprising an analog to digital converter configured to convert the output signal output from the sound processor to output the converted signal to the analyzer between the sound processor and the speaker.

10. A method for controlling sound output, the method comprising:
    outputting an output signal of an output level required for a sound to a speaker;
    monitoring whether an output level of the output signal output through the speaker exceeds a maximum output level of the speaker;
    converting the output signal into a signal of a frequency domain in response to the output level of the output signal exceeding the maximum output level of the speaker and analyzing an energy amount for each frequency; and
    controlling a volume of the output signal corresponding to the frequency band having an energy amount exceeding a threshold value among the output signal of each frequency band when a frequency band having the energy amount exceeding the threshold value is detected.

11. The method of claim 10, wherein the controlling the volume of the output signal comprises controlling the volume in such a manner that a priority order is given to the signal of the frequency bands having a higher energy amount among the signals of the frequency bands having the energy amount exceeding the threshold value when the frequency bands having the energy amount exceeding the threshold value is two or more.

12. The method of claim 10, wherein the controlling of the volume for the output signal comprises controlling the volume according to the output priority order stored in the database with respect to the signals of the frequency bands having the energy amount exceeding the threshold value, when a number of the frequency bands having the energy amount exceeding the threshold value exceeds a set number.

\* \* \* \* \*